(12) United States Patent
Snyder et al.

(10) Patent No.: US 7,291,524 B2
(45) Date of Patent: Nov. 6, 2007

(54) SCHOTTKY-BARRIER MOSFET MANUFACTURING METHOD USING ISOTROPIC ETCH PROCESS

(75) Inventors: John P. Snyder, Edina, MN (US); John M. Larson, Northfield, MN (US)

(73) Assignee: Spinnaker Semiconductor, Inc., Eagan, MN (US)

( * ) Notice: Subject to any disclaimer, the term of this patent is extended or adjusted under 35 U.S.C. 154(b) by 0 days.

(21) Appl. No.: 10/957,913

(22) Filed: Oct. 4, 2004

(65) Prior Publication Data

US 2005/0118793 A1 Jun. 2, 2005

Related U.S. Application Data

(60) Provisional application No. 60/509,142, filed on Oct. 3, 2003.

(51) Int. Cl.
*H01L 21/338* (2006.01)
(52) U.S. Cl. .............. 438/167; 438/92; 438/570; 257/E21.106; 257/E21.131
(58) Field of Classification Search ............ 438/92, 438/167, 570, 581, 583
See application file for complete search history.

(56) References Cited

U.S. PATENT DOCUMENTS

| 5,834,793 | A | 11/1998 | Shibata et al. |
| 5,864,161 | A | 1/1999 | Mitani et al. |
| 6,303,479 | B1 * | 10/2001 | Snyder .................. 438/581 |
| 6,495,882 | B2 | 12/2002 | Snyder |
| 6,744,103 | B2 | 6/2004 | Snyder |
| 6,784,035 | B2 | 8/2004 | Snyder et al. |
| 6,887,747 | B2 * | 5/2005 | Yagishita et al. ........... 438/197 |
| 6,949,787 | B2 | 9/2005 | Snyder et al. |
| 6,974,737 | B2 | 12/2005 | Snyder et al. |
| 7,052,945 | B2 | 5/2006 | Snyder |

FOREIGN PATENT DOCUMENTS

WO     WO 03/015181 A     2/2003

\* cited by examiner

*Primary Examiner*—Fernando L. Toledo
(74) *Attorney, Agent, or Firm*—Dorsey & Whitney LLP

(57) ABSTRACT

A method of fabricating a transistor device for regulating the flow of electric current is provided wherein the device has Schottky-barrier metal source-drain contacts. The method, in one embodiment, utilizes an isotropic etch process prior to the formation of the metal source-drain contacts to provide better control of the Schottky-barrier junction location to a channel region. The improvements from the controllability of the placement of the Schottky-barrier junction enables additional drive current and optimizes device performance, thereby significantly improving manufacturability.

2 Claims, 6 Drawing Sheets

SCHOTTKY-BARRIER MOSFET MANUFACTURING METHOD USING ISOTROPIC ETCH PROCESS

CROSS-REFERENCE TO RELATED APPLICATION(S)

This application claims the benefit of and priority to U.S. provisional patent application Ser. No. 60/509,142, filed Oct. 3, 2003 which is incorporated by reference herein in its entirety.

FIELD OF THE INVENTION

The present invention relates to semiconductor devices for regulating the flow of electric current, and has specific application to the fabrication of these devices in the context of an integrated circuit ("IC"). More particularly, the present invention relates to a transistor for regulating the flow of electric current having metal source and/or drain forming Schottky or Schottky-like contacts to a channel region.

BACKGROUND OF THE INVENTION

One type of transistor known in the art is a Schottky-barrier metal oxide semiconductor field effect transistor ("Schottky-barrier MOSFET" or "SB-MOS). As shown in FIG. 1, the SB-MOS device 100 comprises a semiconductor substrate 110 in which a source electrode 120 and a drain electrode 125 are formed, separated by a channel region 140 having channel dopants. The channel region 140 is the current-carrying region of the substrate 110. For purposes of the present invention, the channel region 140 in the semiconductor substrate 110 extends vertically below the gate insulator 150 to a boundary approximately aligned with the bottom edge of the source 120 and bottom edge of the drain 125 electrodes. The channel dopants typically have a maximum dopant concentration 115, which is typically below the source 120 and drain 125 electrodes, and thus outside of the channel region 140.

For a SB-MOS device at least one of the source 120 or the drain 125 contacts is composed partially or fully of a metal silicide. Because at least one of the source 120 or the drain 125 contacts is composed in part of a metal, they form Schottky or Schottky-like contacts with the substrate 110 and the channel region 140. A Schottky contact is defined as a contact formed by the intimate contact between a metal and a semiconductor, and a Schottky-like contact is defined as a contact formed by the close proximity of a semiconductor and a metal. The Schottky contacts or Schottky-like contacts or junctions 130, 135 may be provided by forming the source 120 or the drain 125 from a metal silicide. The channel length is defined as the distance from the source 120 contact to the drain 125 contact, laterally across the channel region 140.

The Schottky or Schottky-like contacts or junctions 130, 135 are located in an area adjacent to the channel region 140 formed between the source 120 and drain 125. An insulating layer 150 is located on top of the channel region 140. The insulating layer 150 is composed of a material such as silicon dioxide. The channel region 140 extends vertically from the insulating layer 150 to the bottom of the source 120 and drain 125 electrodes. A gate electrode 160 is positioned on top of the insulating layer 150, and a thin insulating layer 170 surrounds the gate electrode 160. The thin insulating layer 170 is also known as the spacer. The gate electrode 160 may be doped poly silicon. The source 120 and drain 125 electrodes may extend laterally below the spacer 170 and gate electrode 160. A field oxide 190 electrically isolates devices from one another. An exemplary Schottky-barrier device is disclosed in Spinnaker's U.S. Pat. No. 6,303,479.

There is a need in the industry for a SB-MOS fabrication method that provides a SB-MOS device with improved performance, manufacturability and cost benefits.

BRIEF SUMMARY OF THE INVENTION

In one aspect, the present invention provides a method of fabricating a Schottky barrier MOSFET ("SB-MOS") device wherein at least one of the source and drain contact regions is comprised of a metal, whereby the placement of the metal source and/or drain regions is controlled in a manufacturable way. In another aspect of the present invention the placement of the metal source and/or drain regions is controlled by a partially isotropic etch.

While multiple embodiments are disclosed, still other embodiments of the present invention will become apparent to those skilled in the art from the following detailed description, which shows and describes illustrative embodiments of the invention. As it will be realized, the invention is capable of modifications in various obvious aspects, all without departing from the spirit and scope of the present invention. Accordingly, the drawings and detailed description are to be regarded as illustrative in nature and not restrictive.

DETAILED DESCRIPTION

In general, the present invention provides a method of fabrication of SB-MOS devices. In one embodiment of the present invention a method of fabricating a SB-MOS device includes providing a semiconductor substrate and doping the semiconductor substrate and channel region. The method further includes providing an electrically insulating layer in contact with the semiconductor substrate. The method further includes providing a gate electrode on the insulating layer, providing a thin insulating layer around the gate electrode and exposing the substrate on one or more areas proximal to the gate electrode. The method further includes etching of the exposed areas proximal to the gate electrode using a partially isotropic etch. The method further includes depositing a thin film of metal and reacting the metal with the exposed substrate, such that a metal silicide forms on the substrate. The method further includes removing any unreacted metal.

One of the advantages of the present invention is that the metal source and drain electrodes provide significantly reduced parasitic series resistance (~10 Ω-μm) and contact resistance (less than $10^{-8}$ Ω-cm$^2$). The built-in Schottky barrier at the Schottky contacts provides superior control of off-state leakage current. The device substantially eliminates parasitic bipolar action, making it unconditionally immune to latch-up, snapback effects, and multi-cell soft errors in memory and logic. Elimination of bipolar action also significantly reduces the occurrence of other deleterious effects related to parasitic bipolar action such as single event upsets and single cell soft errors. The device of the present invention is easily manufacturable, requiring two fewer masks for source/drain formation, no shallow extension or deep source/drain implants, and a low temperature source/drain formation process. Due to low temperature processing, integration of new, potentially critical materials such as high K gate insulators, strained silicon and metal gates is made easier.

Figure 1:
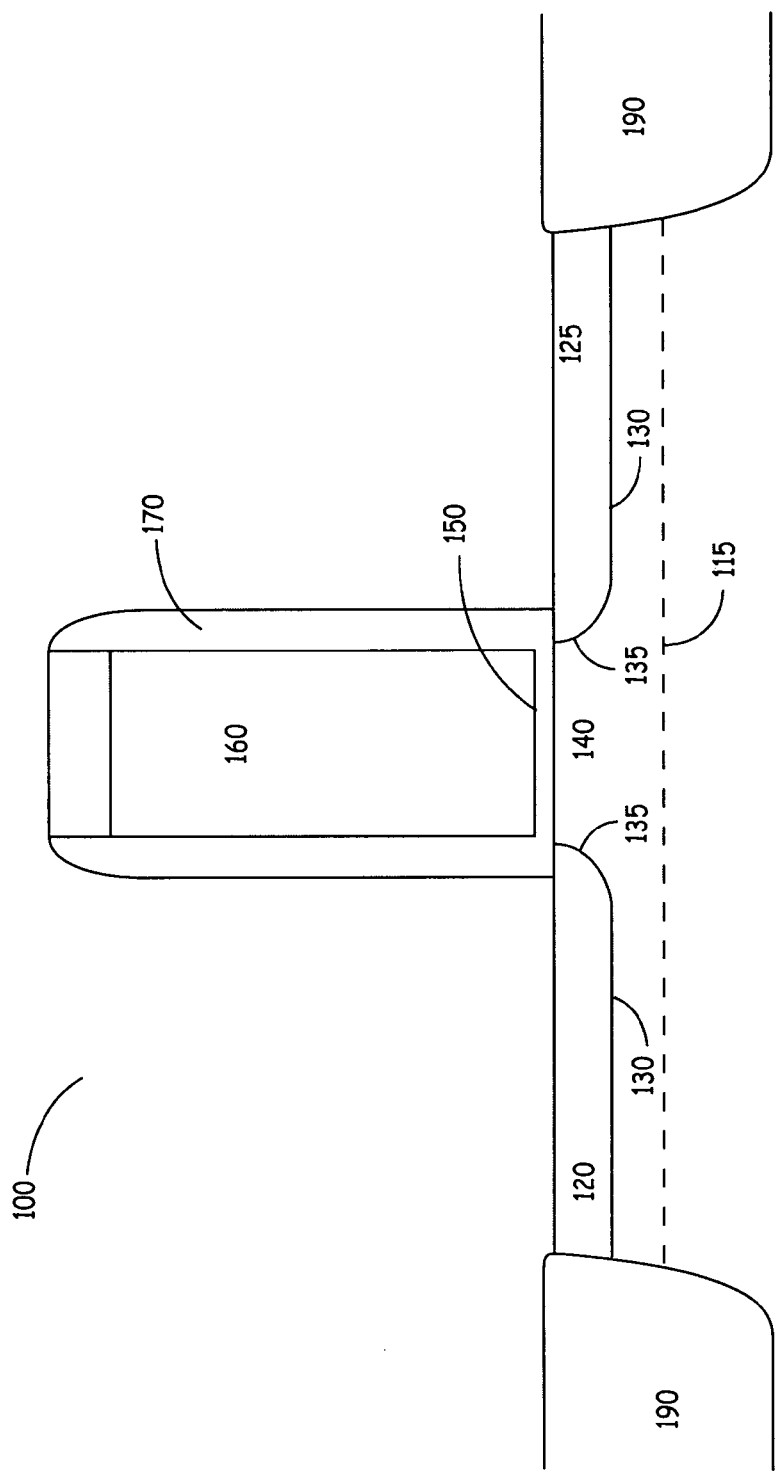
FIG. 1 illustrates a sectional view of an existing Schottky-barrier metal oxide semiconductor field effect transistor ("Schottky barrier MOSFET" or "SB-MOS")
Figure 2:
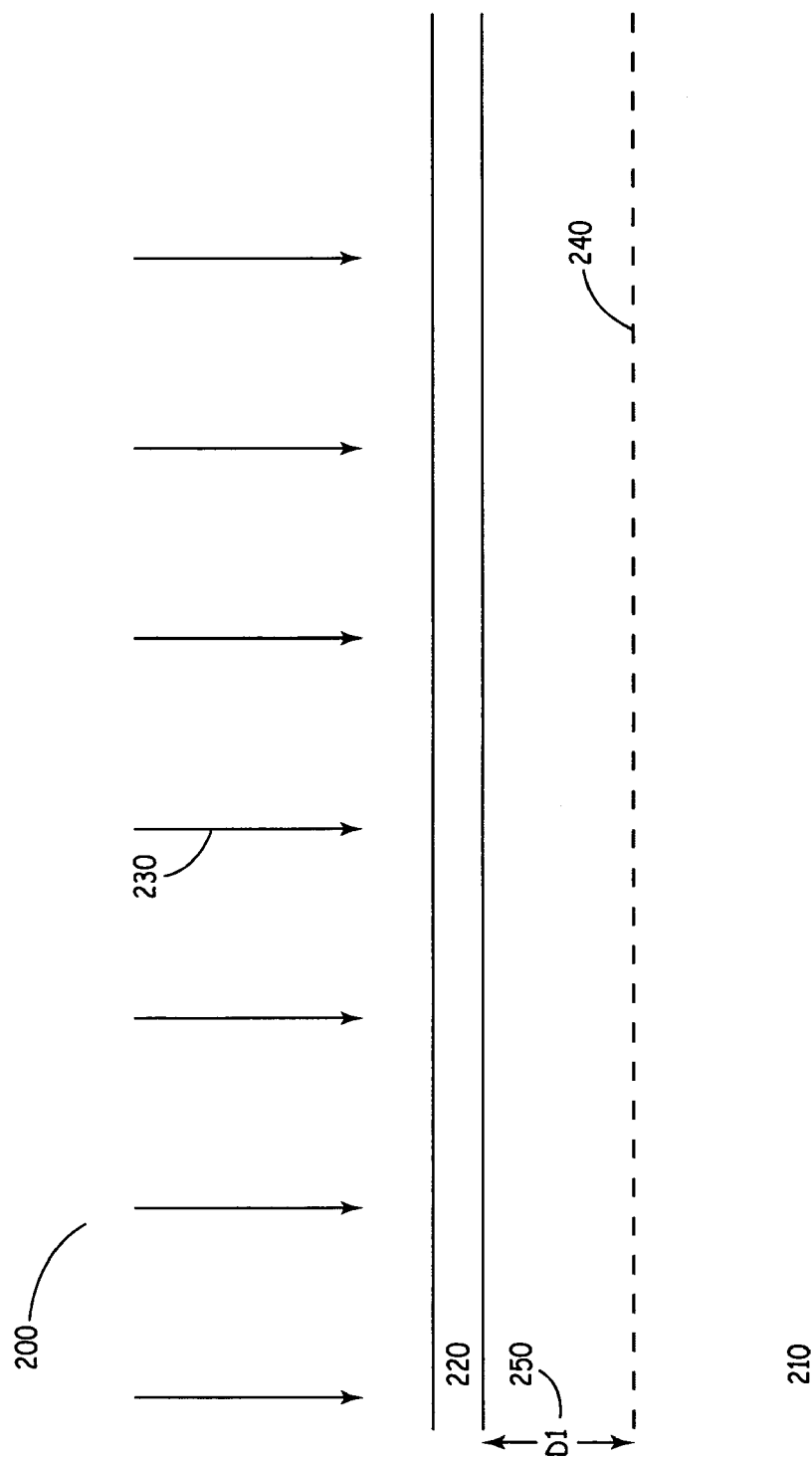
FIG. 2 illustrates an exemplary embodiment of the present invention process using implantation of the semiconductor substrate.

FIG. 2 shows a silicon substrate 210 that has means for electrically isolating transistors from one another. Throughout the discussion herein, there will be examples provided that make reference to a semiconductor substrate on which an SB-MOS device is formed. The present invention does not restrict the semiconductor substrate to any particular type. One skilled in the art will readily realize that many semiconductor substrates may be used for SB-MOS devices including for example silicon, silicon germanium, gallium arsenide, indium phosphide, strained semiconductor substrates, and silicon on insulator (SOI). These substrate materials and any other semiconductor substrate may be used and are within the scope of the teachings of the present invention.

As shown in FIG. 2, a thin screen oxide 220 is grown on the substrate 210 to act as an implant mask. In one embodiment, the oxide is grown to a thickness of approximately 200 Å. The appropriate channel dopant species 230 is then ion-implanted through the screen oxide such that a maximum dopant concentration 240 is provided to a predetermined depth D1 250 in the silicon. In one embodiment, the channel dopant species is Arsenic for P-type devices and Indium for N-type devices. However, it is appreciated that any other suitable channel dopant species commonly used at the transistor for P-type or N-type devices can be used in accordance with the principles of the present invention. In another embodiment, the channel dopant concentration profile varies significantly in the vertical direction but is generally constant in the lateral direction. In a further embodiment, the depth D1 250 of the maximum dopant concentration is approximately 20 to 200 nm.

Figure 3:
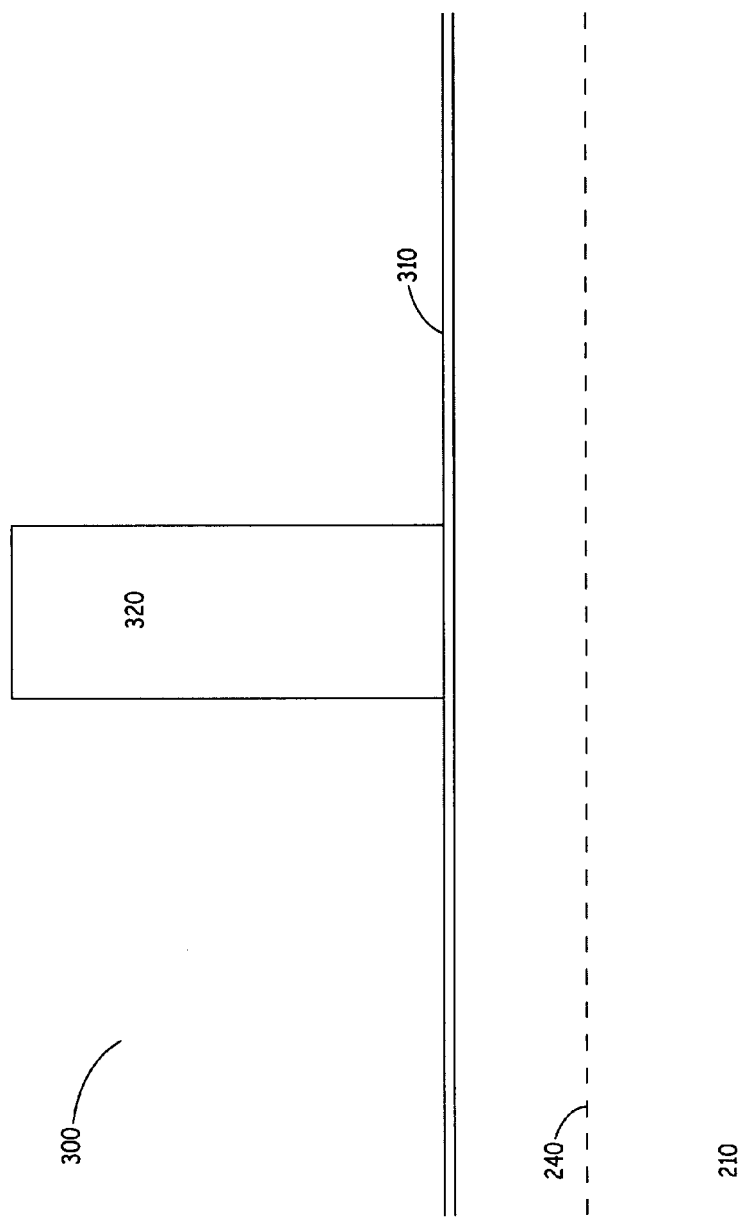
FIG. 3 illustrates an exemplary embodiment of the present invention process using a patterned silicon film on a thin gate insulator.

As shown in FIG. 3, the screen oxide is then removed in a chemical etch, and a thin gate insulator 310, such as silicon dioxide, is grown. In one embodiment, the screen oxide etch is comprised of hydrofluoric acid. However, any other suitable chemistries commonly used to etch oxide, including both wet and dry etches, can be used in accordance with the principles of the present invention. In another embodiment, the thin gate insulator is comprised of silicon dioxide with a thickness of approximately 6 to 50 Å. In a further embodiment, a material having a high dielectric constant (high K) is provided. Examples of high K materials are those materials having dielectric constants greater than that of silicon dioxide, including for example nitrided silicon dioxide, silicon nitride, and metal oxides such as $TiO_2$, $Al_2O_3$, $La_2O_3$, $HfO_2$, $ZrO_2$, $CeO_2$, $Ta_2O_5$, $WO_3$, $Y_2O_3$, and $LaAlO_3$, and the like. The gate insulator growth is immediately followed by providing an in-situ doped silicon film. The film is heavily doped with, for example, Phosphorous for an N-type device and Boron for a P-type device. Using lithographic techniques and a silicon etch, the gate electrode 320 is patterned as shown in the process step 300 illustrated in FIG. 3. In one embodiment, following gate electrode patterning, additional channel dopants are provided and result in a channel dopant concentration profile that varies significantly in both the vertical and lateral directions.

Figure 4:
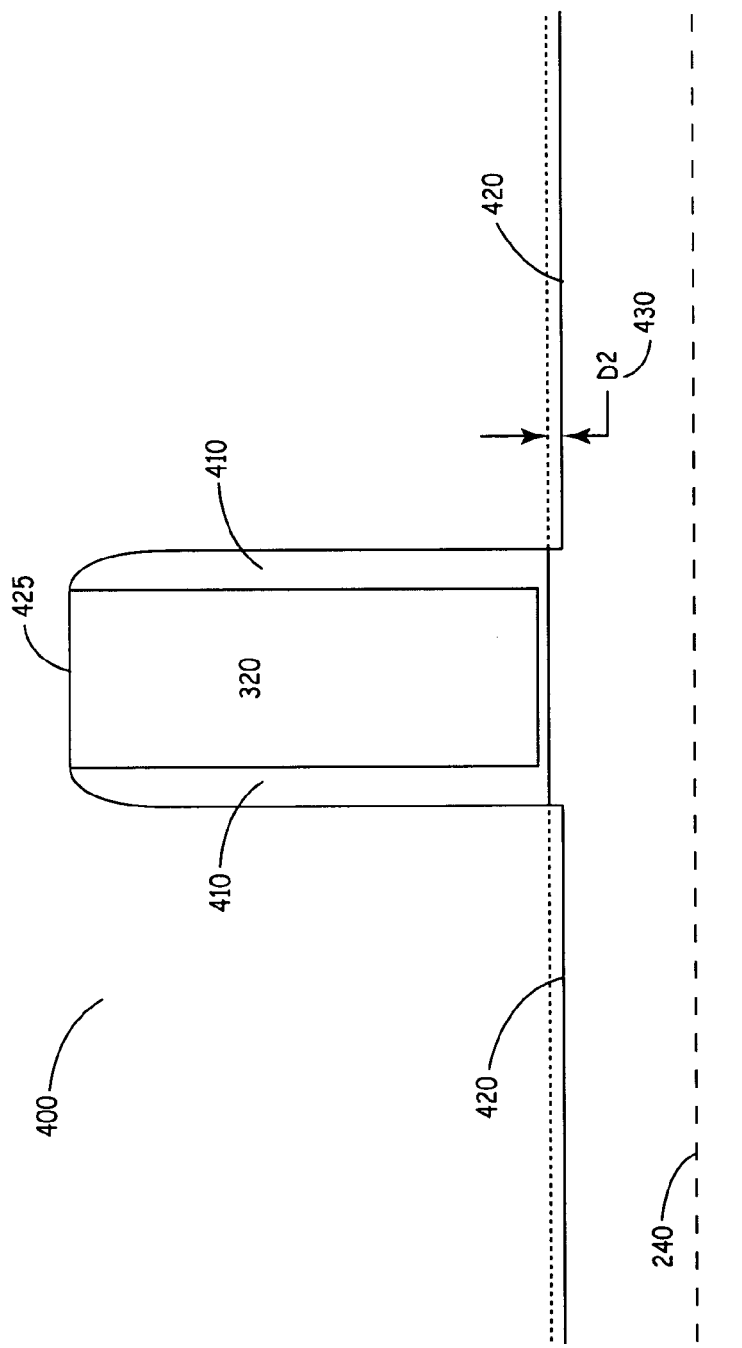
FIG. 4 illustrates an exemplary embodiment of the present invention process using a formation of thin insulator sidewalls, and exposure of the silicon in the gate, source and drain areas.

As shown in FIG. 4, a thin insulator is then provided on the top surface 425 and sidewalls 410 of the silicon gate electrode 320. In one embodiment, the thin insulator is a thermally grown oxide that has a thickness of approximately 50 to 500 Å. In another embodiment, the thermally grown thin oxide is provided by a rapid thermal oxidation (RTO) process having a maximum temperature of 900 to 1200° C. for a dwell time of 0.0 to 60 seconds. One skilled in the art will readily realize that there are many manufacturing methods for providing thin insulator layers such as deposition. One skilled in the art will further realize that other materials may be used for the thin insulator, such as nitrides, and that the insulating layer may be comprised of multiple insulator materials. An anisotropic etch is then used to remove the insulator layer on the horizontal surfaces (and thus expose the silicon 420, 425) thereby exposing the horizontal surface, while preserving the insulator layer on the vertical surfaces. In this way, a sidewall insulator 410 is formed. It will be appreciated by one skilled in the art that the gate electrode 320 and the sidewall insulator 410 function as a mask to the anisotropic etch such that the openings in the thin insulator layer on the silicon substrate are proximal with the gate electrode 320. In the embodiment in which the thin insulator is approximately 50 to 500 Å, the openings in the thin insulator layer will be proximal to the gate electrode 320 and located within a lateral distance away from the gate electrode 320 that is approximately 50 to 500 Å. In one exemplary embodiment, the silicon surface 420 is recessed below the bottom of the gate insulator to a depth D2 430 of approximately 1 nm to approximately 5 nm. In the embodiment in which an RTO process is used to provide the sidewall insulator, the dopants both in the gate electrode and in the channel region of the device are electrically activated simultaneously with the sidewall insulator formation, as shown in the process step 400 illustrated in FIG. 4.

Figure 5:
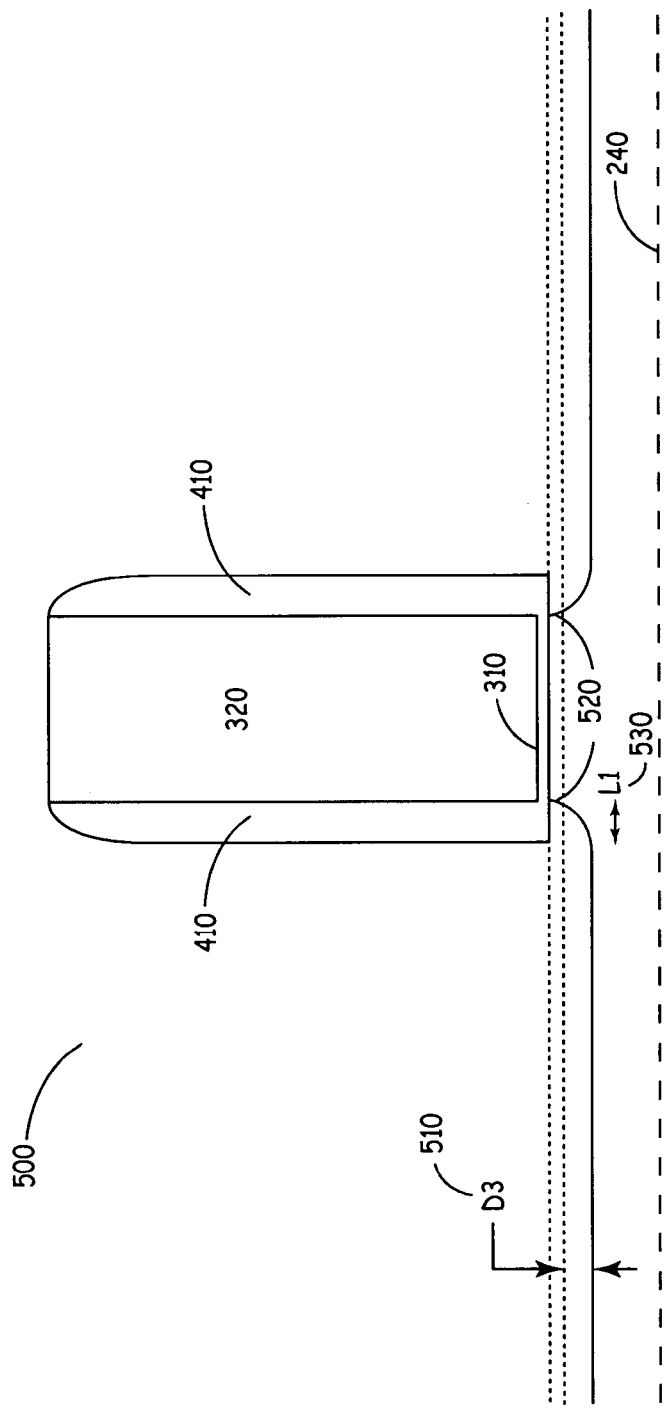
FIG. 5 illustrates an exemplary embodiment of the present invention process using a partially isotropic etch.

As shown in FIG. 5, a second etch process step etches the semiconductor substrate both laterally and vertically. This etch is known as a partially isotropic etch. In one embodiment, a partially isotropic etch having a lateral etch rate at least 10% of a vertical etch rate is used. In another embodiment, a partially isotropic etch having a vertical etch rate at least 10% of a lateral etch rate is used. The depth of the second etch is D3 510. The lateral etch displaces the exposed vertical sidewall of the semiconductor substrate 520 laterally a distance L1 530 from the edge of the sidewall oxide 410 to a position below the gate electrode 320. Because the etch is partially isotropic, L1 may be less than or equal to ten times D3 or D3 may be less than or equal to ten times L1. In yet another embodiment, an etch having a lateral etch rate approximately equal to a vertical etch rate is used. For this embodiment, D3 may be approximately equal to L1. In yet a further embodiment, the partially isotropic etch is provided by any one or a combination of a $SF_6$ dry etch, a $HF:HNO_3$ wet etch, or any wet or dry etch that is commonly used for the purpose of etching semiconductor material.

Figure 6:
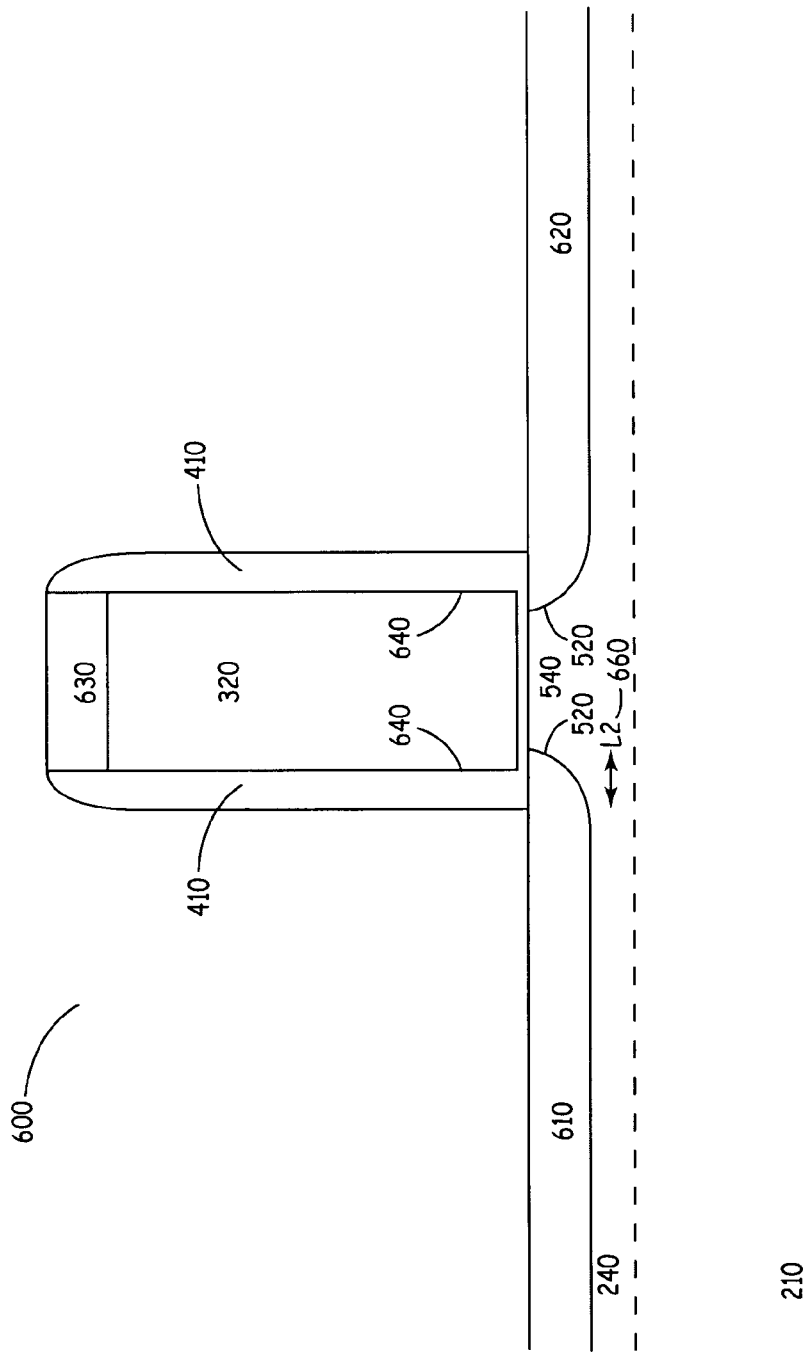
FIG. 6 illustrates an exemplary embodiment of the present invention process using a metal deposition, silicidation anneal, and removal of unreacted metal.

As shown in FIG. 6, the next step encompasses depositing an appropriate metal as a blanket film on all exposed surfaces. Deposition may be provided by either a sputter or evaporation process or more generally any thin film formation process. In one embodiment, the substrate is heated during metal deposition to encourage diffusion of the impinging metal atoms to the exposed silicon surface 520, below the gate insulator. In one embodiment, this metal is approximately 250 Å thick but more generally approximately 50 to 1000 Å thick. Throughout the discussion herein there will be examples provided that make reference to Schottky and Schottky-like barriers and contacts in regards to IC fabrication. The present invention does not recognize any limitations in regards to what types of Schottky interfaces may be used in affecting the scope of the present invention. Thus, the present invention specifically anticipates these types of contacts to be created with any form of conductive material or alloy. For example, for the P-type device, the metal source and drain 610,620 may be formed from any one or a combination of Platinum Silicide, Palladium Silicide, or Iridium Silicide. For the N-type device, the metal source and drain 610,620 may be formed from a material from the group comprising Rare Earth Silicides such as Erbium Silicide, Dysprosium Silicide or Ytterbium Silicide, or combinations thereof. It is appreciated that any other suitable metals commonly used at the transistor level, such as titanium, cobalt and the like, can be used as well as a plethora of more exotic metals and other alloys. In another embodiment, the silicided source/drain can be made of multiple layers of metal silicide, in which case other exemplary silicides, such as titanium silicide or tungsten silicide for example, may be used.

The wafer is then annealed for a specified time at a specified temperature so that, at all places where the metal is in direct contact with the silicon, a chemical reaction takes place that converts the metal to a metal silicide 610, 620, 630. In one embodiment, for example, the wafer is annealed at about 400° C. for about 45 minutes or more generally approximately 300 to 700° C. for approximately 1 to 120 min. The metal that was in direct contact with a non-silicon surface such as the gate sidewall spacer 410 is left unreacted and thereby unaffected.

A wet chemical etch is then used to remove the unreacted metal while leaving the metal-silicide untouched. In one embodiment, aqua regia is used to remove Platinum and $HNO_3$ is used to remove Erbium. It is appreciated that any other suitable etch chemistries commonly used for the purpose of etching Platinum or Erbium, or any other suitable metal systems used to form Schottky or Schottky-like contacts can be used within the scope of the present invention. The channel-implanted, short channel SB-MOS device is now complete and ready for electrical contacting to gate 320, source 610, and drain 620, as shown in the process step 600 illustrated in FIG. 6.

As a result of this exemplary process, Schottky or Schottky-like contacts are formed to the channel region 540 and substrate 210 respectively wherein the Schottky contacts are located at a position controlled by the partially isotropic etch process. In one embodiment, the interface 520 of the source 610 and drain 620 electrodes to the channel region 540 is located laterally below the spacer 410 and is aligned with the edge of the sides of the gate electrodes 640. In another embodiment, the interface 520 of the source 610 and drain 620 electrodes to the channel region 540 is located laterally below the spacer 410 and partially below the gate electrode 320. In yet another embodiment, a gap is formed between the interface 520 of the source 610 and drain 620 electrodes to the channel region 540 and the edge of the sides of the gate electrode 640.

While traditional Schottky contacts are abrupt, the present invention specifically anticipates that in some circumstances an interfacial layer may be utilized between the silicon substrate and the metal. These interfacial layers may be ultra-thin, having a thickness of approximately 10 nm or less. Thus, the present invention specifically anticipates Schottky-like contacts and their equivalents to be useful in implementing the present invention. Furthermore, the interfacial layer may comprise materials that have conductive, semi-conductive, and/or insulator-like properties. For example, ultra-thin interfacial layers of oxide or nitride insulators may be used, ultra-thin dopant layers formed by dopant segregation techniques may be used, or ultra-thin interfacial layers of a semiconductor, such as Germanium, may be used to form Schottky-like contacts, among others.

One of the important performance characteristics for SB-MOS devices is the drive current ($I_d$), which is the electrical current from source to drain when the applied source voltage ($V_s$) is grounded, and the gate voltage ($V_g$) and drain voltage ($V_d$) are biased at the supply voltage ($V_{dd}$). Another important property for SB-MOS devices is the total gate capacitance ($C_g$), which is determined by various capacitances such as that due to gate insulator 310, the fringing field capacitance and the overlap capacitance. Drive current and total gate capacitance are two of the critical parameters that determines circuit performance. For example, the switching speed of a transistor scales as $I_d/C_g$ so that higher drive current devices and lower total gate capacitance devices switch faster, thereby providing higher performance integrated circuits. There are many variables that can affect the drive current and total gate capacitance of a SB-MOS device, including for example, as shown in FIG. 6, the lateral location of the Schottky or Schottky-like contact 520 in relation to the edge of the gate electrode 640.

In a SB-MOS device, the drive current, which is generally determined by the tunneling current density ($J_{SB}$) through the Schottky barrier into the channel, is strongly controlled by the gate induced electric field ($E_s$) located at the interface of the source and the channel region. As the voltage applied to the gate ($V_g$) is increased, $E_S$ will also increase. Increasing $E_S$ modifies the Schottky barrier such that $J_{SB}$ increases approximately according to Equation (1), which shows that $J_{SB}$ is exponentially sensitive to $E_S$, where A and B are constants, and the units of $J_{SB}$ and $E_S$ are (A/cm$^2$) and (V/M) respectively.

$$J_{SB} = Ae^{\left(-\frac{B}{E_S}\right)} \quad (1)$$

In addition to $V_g$, $E_S$ is also strongly affected by the Schottky barrier-channel region interface 520 proximity to the edge of the gate electrode 640. When interface 520 is not located below the gate electrode 320, $E_S$ and therefore $J_{SB}$ and $I_d$ decrease substantially and continue to decrease as the interface moves further laterally away from the edge of the gate electrode 640. Accordingly, the present invention provides a method of fabricating a SB-MOS device that allows the placement of the Schottky or Schottky-like source and drain regions to be accurately controlled with respect to the gate electrode by using a partially isotropic etch. The present invention process provides a means to maximize the electric field $E_s$ and drive current $I_d$ and optimize device performance.

In regards to total gate capacitance $C_g$, the optimal location of the interface 520 in relation to the edge of the gate electrode 640 is a function of device design and performance requirements. In particular, the total gate capacitance $C_g$ will decrease as the distance between the interface 520 and the edge of the gate electrode 640 increases, while, as noted above, the drive current $I_d$ will simultaneously decrease. Performance optimization will require tradeoffs in drive current $I_d$ and total gate capacitance $C_g$, which can be more controllably provided by the teachings of the present invention. For example, by using a partially isotropic etch of the present invention, the location of the interface 520 in relation to the edge of the gate electrode 640 can be provided such that the tradeoffs in gate capacitance $C_g$ and drive current $I_d$ are optimized.

By using the techniques of the present invention, the following, but not limited to, benefits occur. First, the partially isotropic etch step provides additional fabrication control of the precise location of the Schottky or Schottky-like contact placement below the gate electrode. The resulting Schottky or Schottky-like contact position can therefore be controllably placed at a lateral position below the gate electrode to maximize drive current, minimize total gate capacitance and optimize device performance. The second benefit is that by etching below the gate electrode, the effective channel length is reduced. It is appreciated that shorter channel length further improves drive current.

The present invention is particularly suitable for use in situations where short channel length MOSFETs are to be fabricated, especially in the range of channel lengths less than 100 nm. However, nothing in the teachings of the present invention limits application of the teachings of the present invention to these short channel length devices. Advantageous use of the teachings of the present invention may be had with channel lengths of any dimension.

Although the present invention has been described with reference to preferred embodiments, persons skilled in the art will recognize that changes may be made in form and detail without departing from the spirit and scope of the invention. The present invention may be used with any of a number of channel, substrate and well implant profiles. The present invention applies to any use of metal source drain technology, whether it employs SOI substrate, strained Silicon substrate, SiGe substrate, FinFET technology, high K gate insulators, and metal gates. This list is not limited. Any device for regulating the flow of electric current that employs metal source-drain contacts will have the benefits taught herein.

While, the present invention is particularly suitable for use with SB-MOS semiconductor devices, it may also be applied to other semiconductor devices. Thus, while this specification describes a fabrication process for use with SB-MOS devices, this term should be interpreted broadly to include any device for regulating the flow of electrical current having a conducting channel that has two or more points of electrical contact wherein at least one of the electrical contacts is a Schottky or Schottky-like contact.

What is claimed are:

1. A method of manufacturing a device for regulating a flow of electrical current, comprising:

providing a semiconductor substrate;

introducing dopants into the semiconductor substrate, wherein the dopants in a channel region between source and drain electrodes are comprised of Arsenic, Phosphorous, or Antimony;

providing a gate electrode on the semiconductor substrate;

exposing the semiconductor substrate in an area proximal to the gate electrode;

etching the semiconductor substrate on the exposed area using a partially isotropic etch;

depositing a thin film of metal in the etched area of the semiconductor substrate; and reacting the metal with the substrate such that a Schottky or Schottky-like source electrode or drain electrode is formed;

wherein the semiconductor substrate has a channel dopant concentration that varies significantly in a vertical direction and is generally constant in a lateral direction.

2. A method of manufacturing a device for regulating a flow of electrical current, comprising:

providing a semiconductor substrate;

introducing dopants into the semiconductor substrate, wherein the dopants in a channel region between source and drain electrodes are comprised of Boron, Indium, or Gallium;

providing a gate electrode on the semiconductor substrate;

exposing the semiconductor substrate in an area proximal to the gate electrode;

etching the semiconductor substrate on the exposed area using a partially isotropic etch;

depositing a thin film of metal in the etched area of the semiconductor substrate; and reacting the metal with the substrate such that a Schottky or Schottky-like source electrode or drain electrode is formed;

wherein the semiconductor substrate has a channel dopant concentration that varies significantly in a vertical direction and is generally constant in a lateral direction.

* * * * *